(12) United States Patent
Kuo et al.

(10) Patent No.: US 7,812,302 B2
(45) Date of Patent: Oct. 12, 2010

(54) IMAGING SENSOR HAVING MICROLENSES OF DIFFERENT RADII OF CURVATURE

(75) Inventors: Chin-Chen Kuo, Hsinchu (TW); Wu-Chieh Liu, Keelung (TW); Hsiao-Wen Lee, Hsinchu (TW); Bii-Cheng Chang, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 0 days.

(21) Appl. No.: 12/288,257

(22) Filed: Oct. 17, 2008

(65) Prior Publication Data

US 2009/0078855 A1 Mar. 26, 2009

(51) Int. Cl.
*H01L 27/00* (2006.01)

(52) U.S. Cl. .................... 250/208.1; 250/216; 359/626; 348/340

(58) Field of Classification Search ................ 250/216, 250/208.1; 359/619, 626; 348/340
See application file for complete search history.

(56) References Cited

U.S. PATENT DOCUMENTS

| | | | | |
|---|---|---|---|---|
| 5,466,926 A | * | 11/1995 | Sasano et al. ................ 250/216 |
| 6,495,813 B1 | * | 12/2002 | Fan et al. ................ 250/208.1 |
| 7,009,772 B2 | * | 3/2006 | Hsiao et al. ................ 359/619 |
| 7,068,432 B2 | * | 6/2006 | Boettiger et al. ............ 359/619 |
| 7,372,497 B2 | * | 5/2008 | Weng et al. ................ 348/340 |
| 7,505,206 B2 | * | 3/2009 | Deng et al. ................ 359/619 |
| 2005/0041296 A1 | * | 2/2005 | Hsiao et al. ................ 359/619 |
| 2005/0105188 A1 | * | 5/2005 | Hayashi et al. ............. 359/619 |
| 2006/0023312 A1 | | 2/2006 | Boettiger et al. |
| 2006/0152813 A1 | | 7/2006 | Boettiger et al. |
| 2006/0170810 A1 | * | 8/2006 | Kim ........................... 348/340 |
| 2007/0264424 A1 | * | 11/2007 | Wang ......................... 427/162 |
| 2008/0007839 A1 | * | 1/2008 | Deng et al. ................ 359/642 |
| 2008/0011936 A1 | * | 1/2008 | Kuo et al. ................ 250/208.1 |
| 2008/0049126 A1 | * | 2/2008 | Ford et al. ................... 348/294 |
| 2008/0151378 A1 | * | 6/2008 | Kim ............................ 359/626 |
| 2009/0078855 A1 | * | 3/2009 | Kuo et al. ................ 250/208.1 |

FOREIGN PATENT DOCUMENTS

| | | |
|---|---|---|
| JP | 2001-196568 | 7/2001 |
| JP | P2005-327921 A | 11/2005 |

* cited by examiner

*Primary Examiner*—John R Lee
(74) *Attorney, Agent, or Firm*—Muncy, Geissler, Olds & Lowe, PLLC

(57) ABSTRACT

The present invention provides an image sensor which comprises improved microlenses to cope with different optical requirements for oblique incident light or different components of light. In one embodiment, the image sensor comprises at least two microlenses having different radii of curvature. In another embodiment, the image sensor comprises at least one asymmetrical microlens.

9 Claims, 8 Drawing Sheets

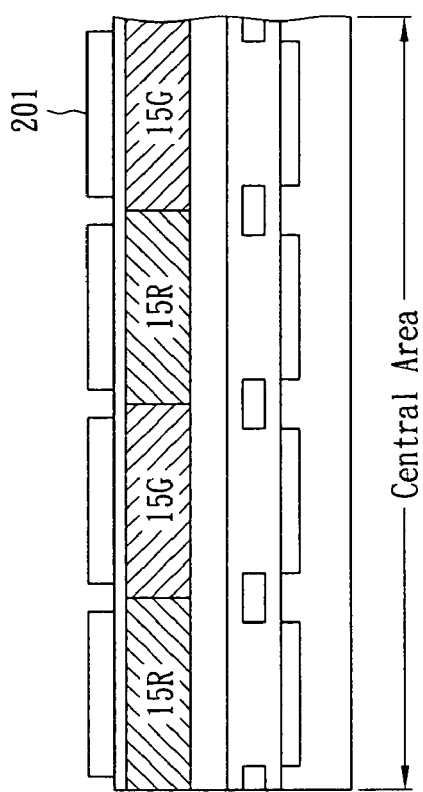
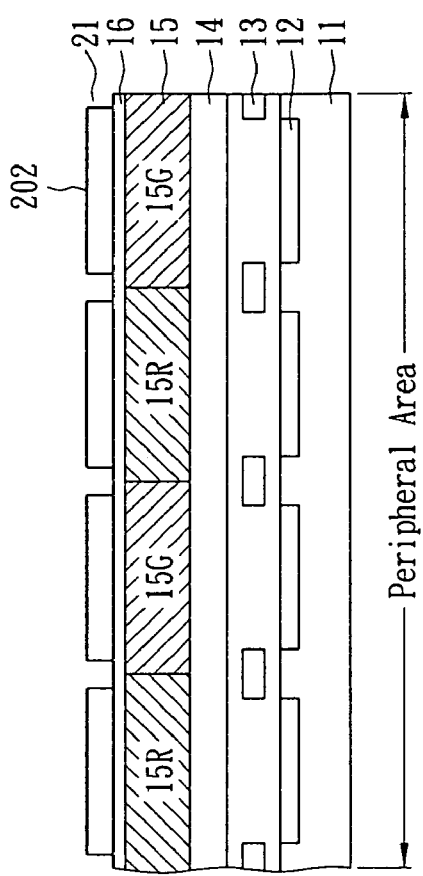
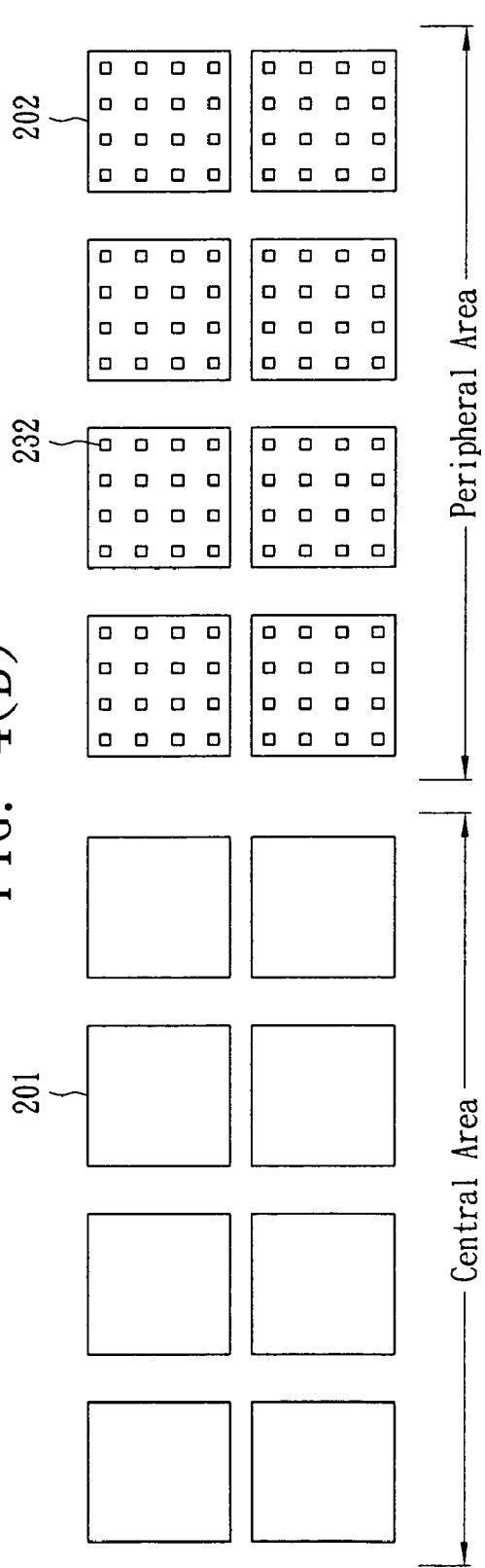
FIG. 4(B)
FIG. 4(C)

IMAGING SENSOR HAVING MICROLENSES OF DIFFERENT RADII OF CURVATURE

BACKGROUND OF THE INVENTION

1. Field of the Invention

This invention relates to an image sensor, and more particularly to an image sensor having microlenses of at least two different radii of curvature, and to an image sensor having an asymmetrical microlens.

2. Description of the Related Art

Digital imaging devices have been widely used in many electronic products nowadays. They are used in, for example, digital cameras, digital video recorders, cellular phones with photographing function, safety-control monitors, etc.

A digital imaging device usually includes an image sensor chip, such as a CCD image sensor chip or a CMOS image sensor chip. For better optical performance, an image sensor chip usually includes a layer of multiple microlenses, so that incident light may better focus on a focal plane, i.e., within a photodiode layer. The photodiode layer receives photons and generates electrical signals thereby.

FIG. 1 shows a cross-sectional view of a conventional image sensor. As shown in FIG. 1, the structure includes a bottom substrate 11, a photodiode layer 12, an interconnection layer 13 (shown as one metal layer for simplicity, but may include multiple metal layers), a passivation layer 14, a color filter layer 15 which includes multiple red (15R), green (15G) and blue (not shown) segments, a spacer layer 16, and a microlens layer 17 which includes multiple microlenses 171 for focusing incident light onto the interface between the photodiode layer 12 and the substrate 11. Layers above the microlens layer 17, such as lens, package and bond pad layers, etc., are omitted for simplicity.

The conventional method for making such an image sensor with microlenses, is to first form a semi-finished substrate with layers 11-16 by conventional semiconductor process steps, and then coat a photoresist layer on the layer 16. The photoresist layer is exposed according to a pattern on a photomask, and developed to form multiple square segments 172 as shown in FIG. 2. Thereafter, a reflow step is taken, that is, the semi-finished substrate with the photoresist layer thereon is subject to a temperature of above 150 degree centigrade for 10 minutes, so that the photoresist layer is partially melted; due to viscosity of the photoresist material, the melted photoresist layer has the contour as the microlenses 171 shown in FIG. 1. Next, the substrate is cooled down to form solid microlenses 171.

The above-mentioned conventional image sensor has the following drawback. The microlenses 171 are all formed of the same radius of curvature. However, light projected onto microlenses at different locations, in particular in an image sensor for use in a medium to large size digital imaging device (mega pixels or above), may have different incident angles. More specifically, as shown in FIG. 3, light vertically projected onto the microlenses at the center area is received by the microlenses at the peripheral area with a tilt angle, causing a vertical shift of focus. The spot sizes 181 at the peripheral area are not satisfactory, and the sensitivity of the image sensor is reduced.

U.S. Pat. No. 6,417,022 discloses a method for producing a microlens with a long focal length, to cope with thick metal layer total thickness due to increased number of metal layers. However, in this cited patent, all of the microlenses on a chip are of the same radius of curvature. This cited patent does not describe any solution to the above-mentioned drawback shown in FIG. 3.

In view of the above, it is desired to provide an image sensor with better sensitivity, wherein the radii of curvature of microlenses at different locations are designed in correspondence with different optical requirements.

SUMMARY OF THE INVENTION

A first object of the present invention is to provide an image sensor comprising at least two microlenses having two different radii of curvature respectively, so as to improve the sensitivity of the image sensor.

A second object of the present invention is to provide an image sensor comprising at least one microlens having an asymmetrical lens structure.

A third object of the present invention is to provide methods for making the above-mentioned image sensors.

To achieve the foregoing objects, the present invention provides an image sensor comprising at least two microlenses having two different radii of curvature, wherein a microlens having a smaller radius of curvature may be arranged at a central area of the image sensor, and a microlens having a larger radius of curvature may be arranged at a peripheral area of the image sensor. Or, a microlens having a smaller radius of curvature may be arranged at a location corresponding to a first color pixel, and a microlens having a larger radius of curvature may be arranged at a location corresponding to a second color pixel.

The present invention also provides an image sensor comprising at least one microlens having an asymmetrical lens structure, which may preferably be arranged at a peripheral location of the image sensor.

The present invention further provides a method for making an image sensor, which comprises: providing a semi-finished substrate; coating a photoresist material on the semi-finished substrate; patterning the photoresist material into a plurality of subsets, including at least a first subset and a second subset having different patterns from each other; and reflowing the photoresist material wherein the first subset and the second subset form different contours. In this method, the patterns of the first subset and the second subsets preferably have different clear ratios.

The present invention also provides a method for making an image sensor, which comprises: providing a semi-finished substrate; coating a photoresist material on the semi-finished substrate; patterning the photoresist material into a plurality of subsets, in which at least one of the subsets includes multiple cavities distributed asymmetrically along one horizontal dimension; and reflowing the photoresist material wherein the at least one subset forms an asymmetrical contour.

BRIEF DESCRIPTION OF THE DRAWINGS

The objects, features and advantages of the invention may be better understood within the context of the Description of the Preferred Embodiment, as set forth below, with reference to the accompanying drawings, wherein:

FIGS. 4(A) and 4(B) are cross-sectional views showing a first preferred embodiment according to the present invention, and FIG. 4(C) is a top view corresponding to FIG. 4(B);

FIGS. 5(A)-5(D) show a second preferred embodiment according to the present invention, wherein FIGS. 5(A) and 5(B) are cross-sectional views taken along different cross-section lines of the same image sensor, and FIG. 5(C) is a cross-sectional view taken along the line C-C of FIG. 5(D);

DESCRIPTION OF THE PREFERRED EMBODIMENT

Figure 1:
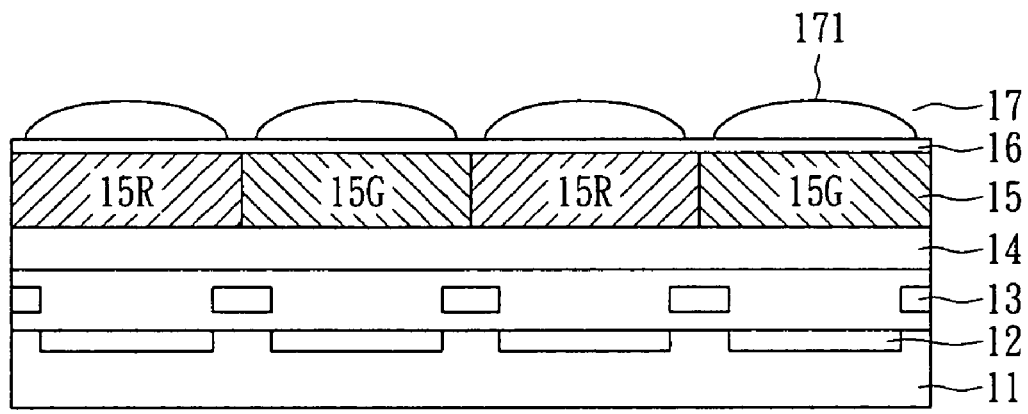
FIG. 1 shows a cross-sectional view of a conventional image sensor.
Figure 2:
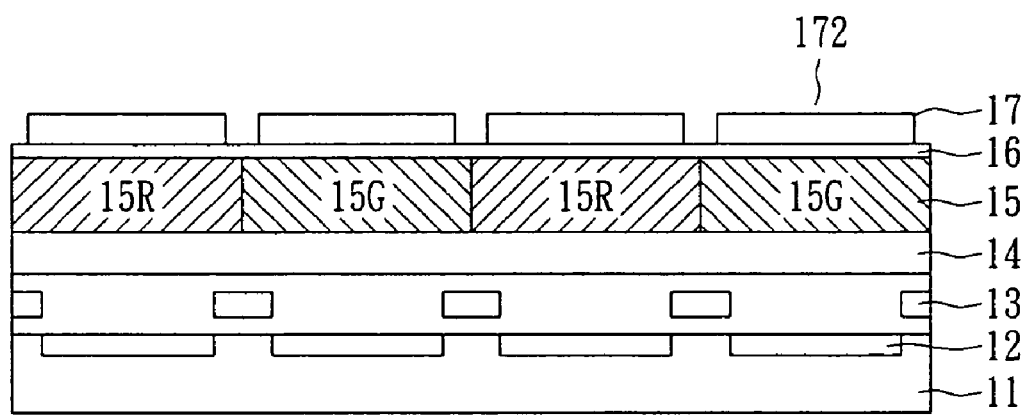
FIG. 2 illustrates how the microlenses in the conventional image sensor are made.
Figure 3:
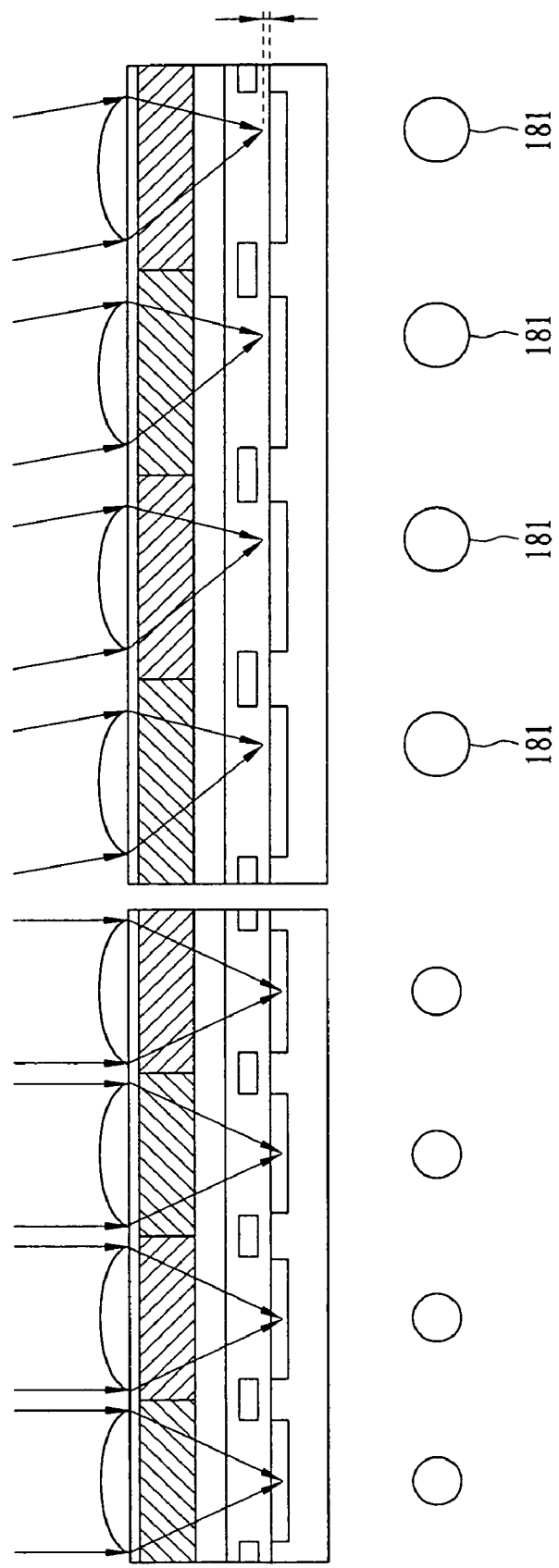
FIG. 3 shows the drawback of the conventional image sensor that there is defocus issue at the peripheral area due to oblique incident light.

The present invention will now be described according to its preferred embodiments and drawings. The drawings are for illustrative purpose only; the thickness and width in the drawings are not drawn according to scale.

Figure 4A:
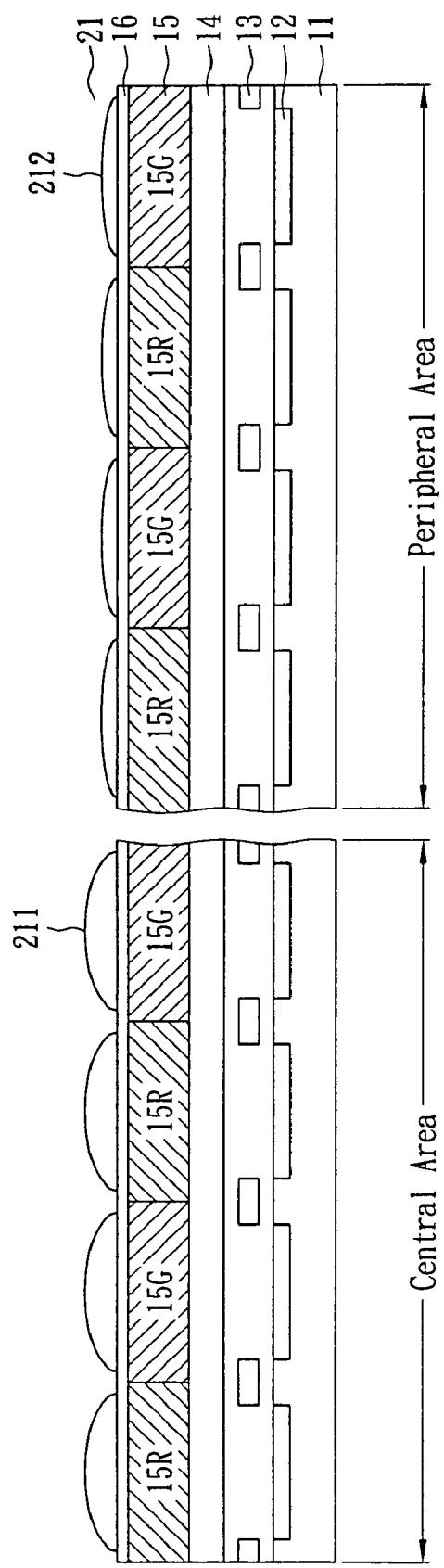

FIGS. 4(A) and (B) are cross-sectional views of a first preferred embodiment according to the present invention, and FIG. 4(C) is a top view corresponding to FIG. 4(B). The left side of the figures shows the structure of an image sensor at its central area, while the right side of the figures shows the structure of the image sensor at its peripheral area. As shown in FIG. 4(A), the microlenses 211 at the central area of the image sensor have a smaller radius of curvature than that of the microlenses 212 at the peripheral area. According to the present invention, the radius of curvature of the microlenses at the central area is preferably in the range from about 2.00 μm to about 2.20 μm, while the radius of curvature of the microlenses at the peripheral area is preferably in the range from about 235 μm to about 2.55 μm.

The structure shown in FIG. 4(A) may be achieved by reducing the volume of the photoresist material forming microlenses 212 at the peripheral area as compared with the volume of the photoresist material forming microlenses 211 at the central area. As an example, referring to FIGS. 4(B) and 4(C), a semi-finished substrate including layers 11-16 is first provided. A photoresist material is coated on the semi-finished substrate to form a photoresist layer 21. After the photoresist material is coated, the central area and the peripheral areas are exposed with different patterns, and developed accordingly. After exposure and development, the photoresist material at the peripheral area forms multiple squares or rectangles 202, each of which has several arrays of cavities 232. As well known by one skilled in this art, this may be done by properly design the photomask used for the exposure. The cavities 232 serve to reduce the volume of the photoresist material in each square or rectangle 202. Although the cavities 232 are shown to have a uniform square shape and are aligned one another, it is apparent that they do not necessarily have to be so. It suffices that the cavities 232 help to reduce the volume of the photoresist material, regardless of the shape and arrangement thereof. However, if it is intended for a microlens 212 to be formed by a square or rectangle 202 to have a symmetrical contour, the cavities 232 in this square or rectangle 202 should preferably be arranged symmetrically.

Next, the substrate with the developed squares or rectangles 201 and 202 is subject to a temperature above 150 degree centigrade, so that the squares or rectangles 201 and 202 are melted. Thereafter, the substrate is cooled down, and the microlenses 211 and 212 are formed as shown in FIG. 4(A).

With the structure shown in FIG. 4(A), the image sensor provides a better optical performance because light incident to the peripheral area of the image sensor focuses better onto the focal plane.

Figure 5A:
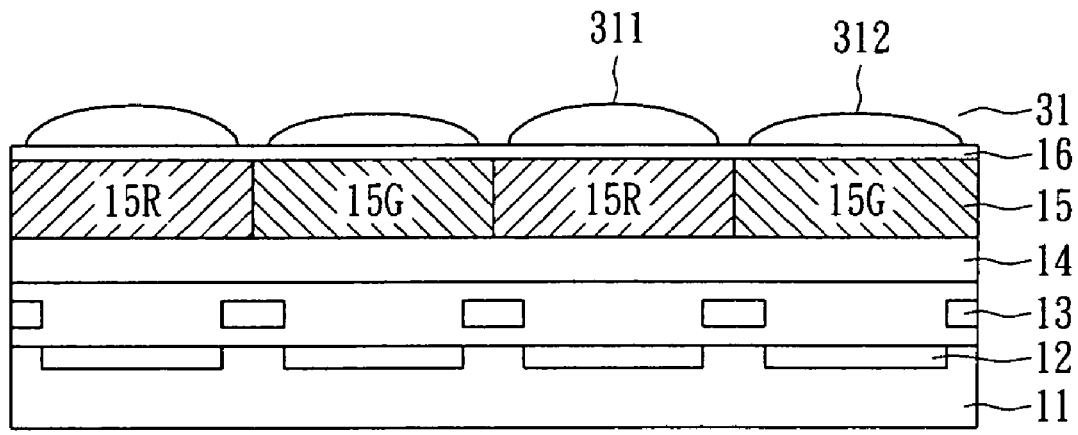
Figure 5B:
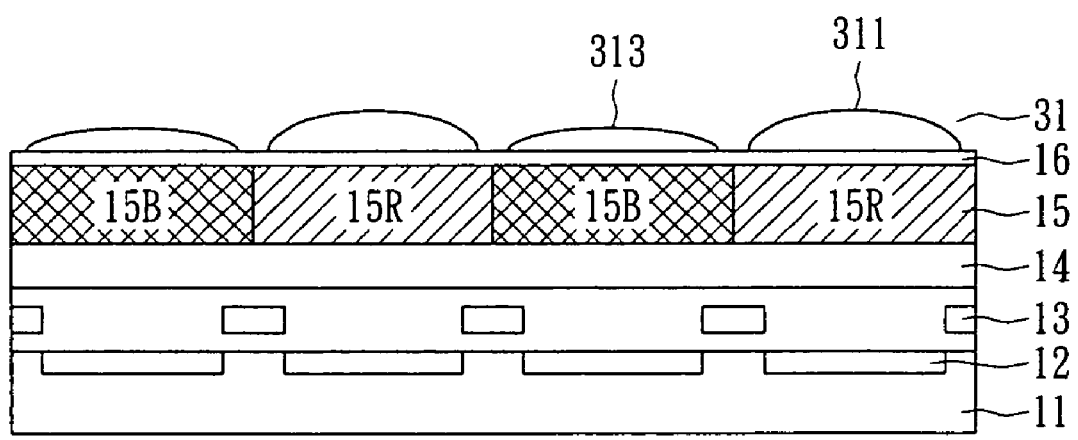

A second embodiment according to the present invention is shown in FIGS. 5(A)-5(D). In addition to providing microlenses of different radii of curvature for central and peripheral areas, respectively, it is also possible to provide microlenses of different radii of curvature for pixels of different colors, to compensate different wavelengths of light. FIGS. 5(A) and 5(B) are cross-sectional views taken along different cross-section lines of the same image sensor, illustrating the contours of microlenses for red, green and blue pixels, respectively. As shown in FIGS. 5(A) and 5(B), the microlenses for red pixels have the smallest radius of curvature; the microlenses for green pixels have the next smallest radius of curvature; while the microlenses for blue pixels have the largest radius of curvature. Such an arrangement may be applied alone, or together with the first embodiment described above; that is, it may be arranged so that the microlenses for red pixels have the same smallest radius of curvature throughout the image sensor, or, the microlenses for red pixels at the central area have a smaller radius of curvature than that of the microlenses for red pixels at the peripheral area, and so are the microlenses for the green and blue pixels. Preferably, the microlenses for red pixels have a radius of curvature in the range from about 2.02 μm to 2.12 μm at the central area, and in the range from about 237 μm to 2.47 μm at the peripheral area; the microlenses for green pixels have a radius of curvature in the range from about 2.05 μm to 2.15 μm at the central area, and in the range from about 2.40 μm to 2.50 μm at the peripheral area; and the microlenses for blue pixels have a radius of curvature in the range from about 2.08 μm to 2.18 μm at the central area, and in the range from about 2.45 to 2.55 at the peripheral area. The microlenses for red pixels preferably have a radius of curvature of about 0.01 μm to 0.06 μm less than that of the microlenses for green pixels, and the microlenses for blue pixels preferably have a radius of curvature of about 0.01 μm to 0.06 μm more than that of the microlenses for green pixels.

Figure 5C:
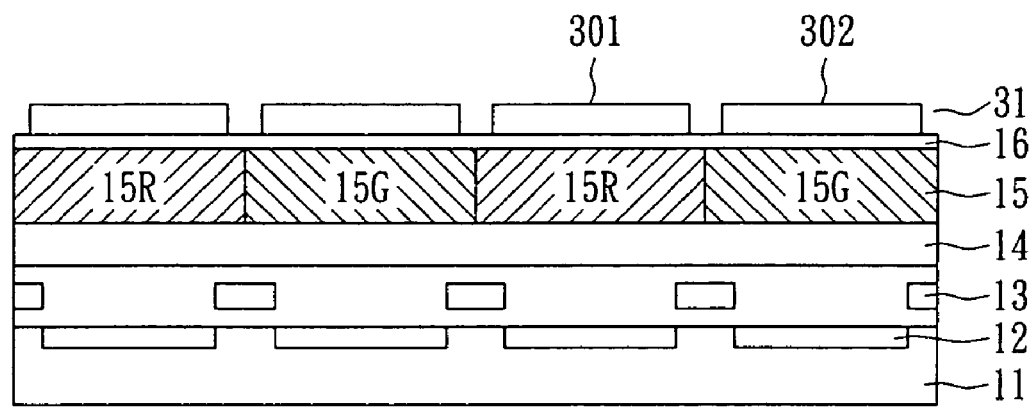
Figure 5D:
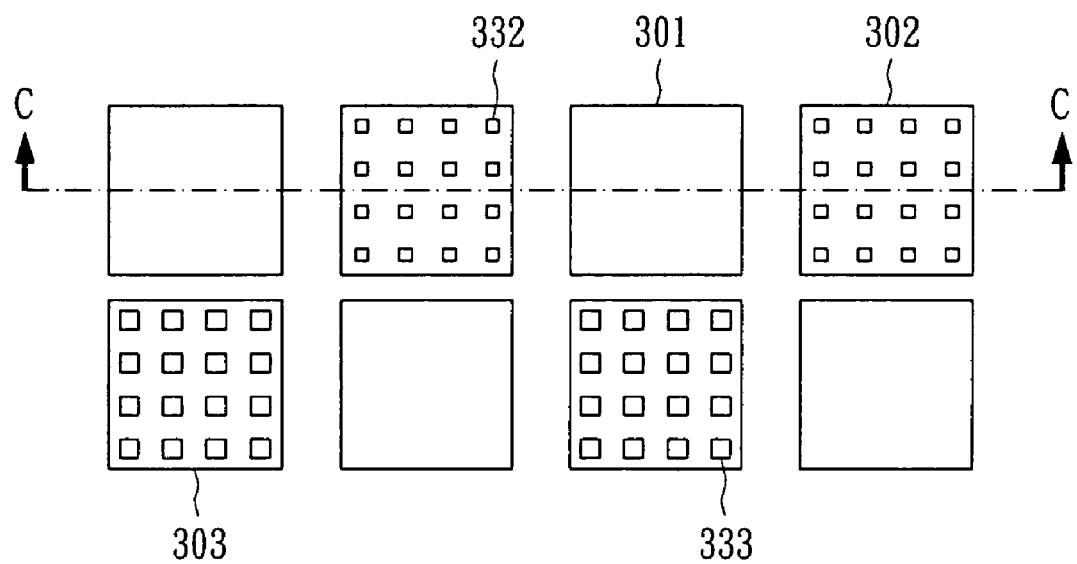

The structure shown in FIGS. 5(A) and 5(B) may be formed by a method described below. Referring to FIGS. 5(C) and 5(D), wherein FIG. 5(C) is a cross-sectional view taken alone the line C-C in FIG. 5(D), a semi-finished substrate including layers 11-16 is first provided. Next, a layer of photoresist material is coated on the semi-finished substrate to form a photoresist layer 31. The photoresist layer 31 are exposed and developed to form multiple squares or rectangles 301, 302 and 303, corresponding to red, green and blue pixels, respectively. By properly designing the photomask for exposure, the squares or rectangles 303 corresponding to blue pixels have a largest total cavity area; the squares or rectangles 302 corresponding to green pixels have a less large total cavity area; and the squares or rectangles 301 corresponding to red pixels have no cavity (as shown) or have a smallest total cavity area (not shown). In the shown embodiment, the squares or rectangles 302 and 303 have the same number of cavities 332 and 333, respectively, while the cavities 333 are larger than the cavities 332. However, other arrangements are also possible, such as that the cavities 332 and 333 are of the same size, but the squares or rectangles 303 include more cavities than the squares or rectangles 302. It suffices as long as the squares or rectangles 303 have a largest total cavity area (clear ratio); the squares or rectangles 302 have a less large total cavity area; and the squares or rectangles 301 have no cavity or have a smallest total cavity area.

Next, the substrate with the developed squares or rectangles 301, 302 and 303 is subject to a temperature above 150 degree centigrade, so that the squares or rectangles 301, 302 and 303 are melted. Thereafter, the substrate is cooled down, and the microlenses 311, 312 and 313 are formed as shown in FIGS. 5(A) and 5(B).

With the structure shown in FIGS. 5(A) and 5(B), whether applied together with the first embodiment or not, the image sensor provides a better optical performance because different wavelengths of light are compensated; different components of light incident to the image sensor may focus better.

Figure 6A:
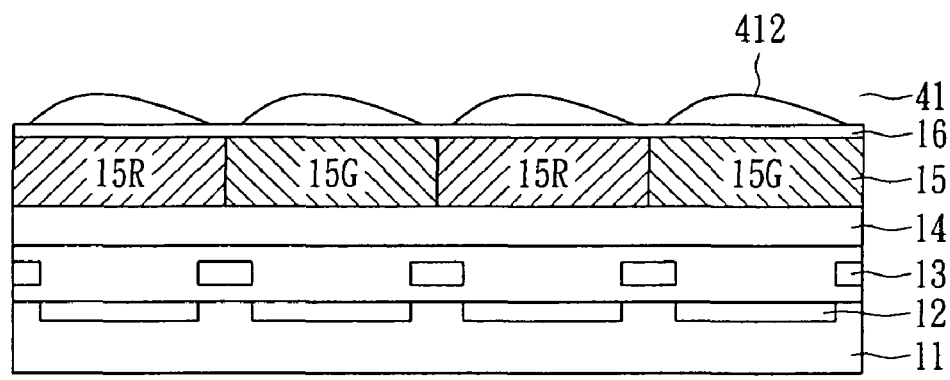
FIGS. 6(A) and 6(B) are cross-sectional views showing a third preferred embodiment according to the present invention.
Figure 6B:
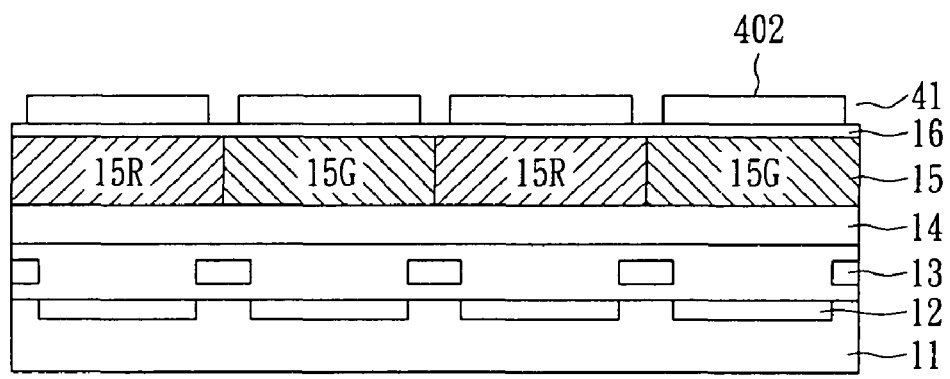
Figure 6C:
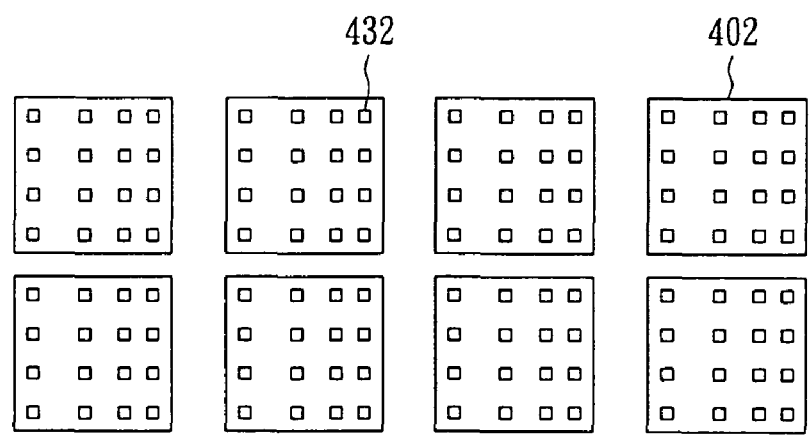
FIG. 6(C) is a top view corresponding to FIG. 6(B)

A third embodiment according to the present invention is shown in FIGS. 6(A)-6(C). According to the present invention, it is also possible to cope with oblique incident light by means of asymmetrical microlenses. Such asymmetrical microlenses may be provided at an area where it is likely to receive oblique incident light, such as the peripheral area. Or, it may be arranged so that all the microlenses in an image sensor are asymmetrical, if desired.

Figure 7C:
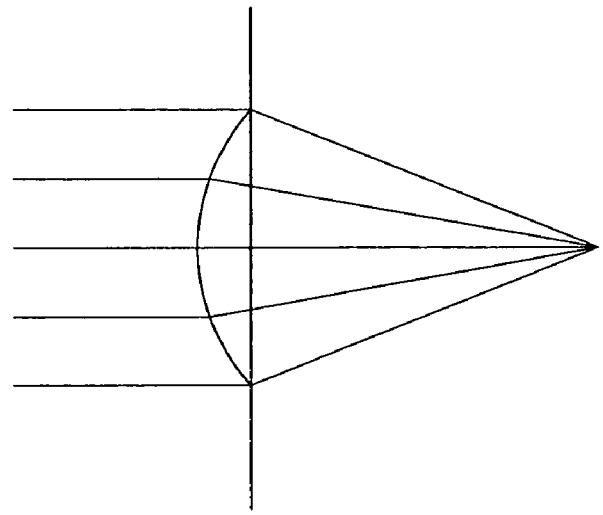
FIGS. 7(A)-7(C) show how light focuses better on the focal plane through the asymmetrical microlens.
Figure 7B:
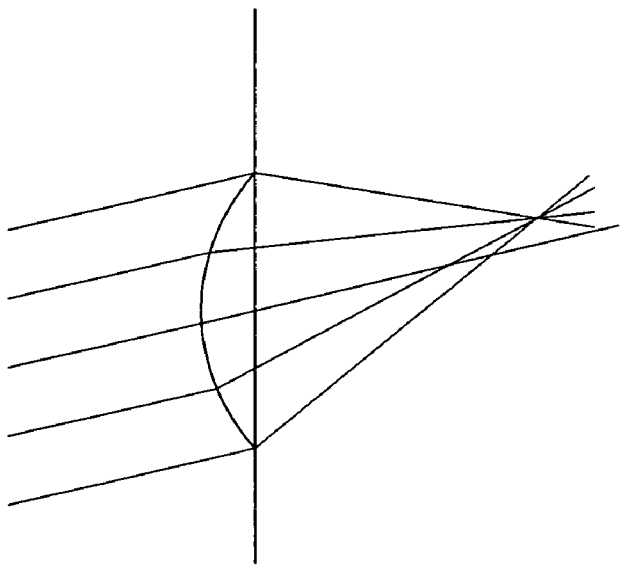
Figure 7A:
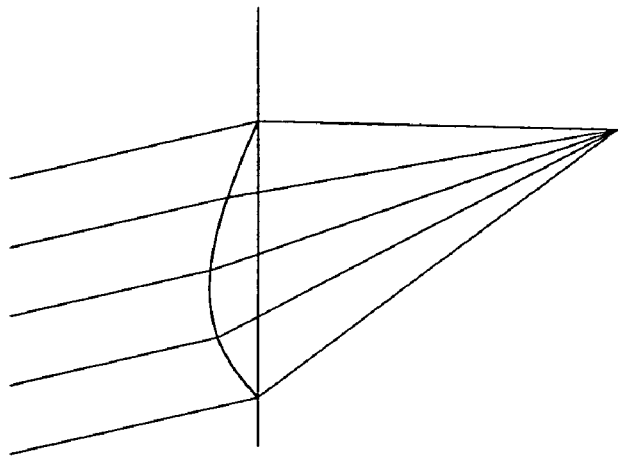

As seen from FIG. 6(A), the microlenses 412 have an asymmetrical contour (i.e., asymmetrical along the cross-section line, in which the left side of each microlens 412 has a smaller radius of curvature than that of its right side. the microlenses 412 may be symmetrical if viewed from a different angle). Such an asymmetrical lens structure serve to better focus oblique incident light. Referring to FIGS. 7(A) and 7(B), a symmetrical lens does well in focusing vertically incident light, but is not so well in focusing oblique light. However, as seen from 7(C), light incident from the left side focuses better onto the focal plane through the asymmetrical microlens 412.

A preferred method for forming such asymmetrical microlenses is described below. Referring to FIGS. 6(B) and 6(C), wherein FIG. 6(C) is a top view corresponding to FIG. 6(B), a semi-finished substrate including layers 11-16 is first provided. Next, a layer of photoresist material is coated on the semi-finished substrate to form a photoresist layer 41. The photoresist layer 41 are exposed and developed to form multiple squares or rectangles 402. As shown in FIG. 6(C), in this embodiment, each square or rectangle 402 includes several arrays of cavities 432, in which the cavities 432 at the right side of each square or rectangle 402 are denser. However, other arrangements are also possible, such as providing larger cavities at the right side of the square or rectangle 402. It suffices as long as the squares or rectangles 402 have an uneven distribution of the photoresist material, in which the portion with less photoresist material will form a lens part with a higher radius of curvature.

The substrate with the developed squares or rectangles 402 is subject to a temperature above 150 degree centigrade, so that the squares or rectangles 402 are melted. Thereafter, the substrate is cooled down, and the asymmetrical microlenses 412 are formed as shown in FIGS. 6(A) and 7(C).

The third embodiment may be applied alone, or together with either or both of the first embodiment and the second embodiment. As described above, the asymmetrical microlens helps to better focus oblique light.

The preferred embodiments of the invention have been described above to illustrate the spirit of the invention rather than to limit the scope of the invention. Substitutions and modifications may be made to steps, materials, structures and other aspects of the invention, as apparent to those skilled in the art. As an example, after exposure and development, the photoresist material needs not be of a square or rectangle shape, but may be of any shape. As another example, the layers under the microlens layer may be arranged otherwise. Therefore, all such substitutions and modifications are intended to be embraced within the scope of the invention as defined in the appended claims.

What is claimed is:

1. An image sensor comprising at least two microlenses having different radii of curvature, wherein said at least two microlenses include a first microlens having a smaller radius of curvature and a second microlens having a larger radius of curvature, the first microlens is only located at a central area of said image sensor and the second microlens is only located at a peripheral area of said image sensor, and said first microlens has a radius of curvature in a range from about 2.00 μm to about 2.20 μm.

2. The image sensor as claimed in claim 1, wherein said second microlens has a radius of curvature in a range from about 2.35 μm to about 2.55 μm.

3. The image sensor as claimed in claim 1, wherein said at least two microlenses includes a first microlens having a smaller radius of curvature corresponding to a first color, and a second microlens having a larger radius of curvature corresponding to a second color.

4. The image sensor as claimed in claim 1, wherein said at least two microlenses includes a first microlens having a smaller radius of curvature corresponding to a red pixel, a second microlens having a less smaller radius of curvature corresponding to a green pixel, and a third microlens having a larger radius of curvature corresponding to a blue pixel.

5. The image sensor as claimed in claim 4, wherein said first microlens has a radius of curvature of about 0.01 to 0.06 less than that of said second microlens.

6. The image sensor as claimed in claim 4, wherein said third microlens has a radius of curvature of about 0.01 to 0.06 more than that of said second microlens.

7. The image sensor as claimed in claim 4, wherein said first microlens has a radius of curvature in a range from about 2.02 μm to 2.12 μm; said second microlens has a radius of curvature in a range from about 2.05 μm to 2.15 μm; and said third microlens has a radius of curvature in a range from about 2.08 μm to 2.18 μm.

8. The image sensor as claimed in claim 4, wherein said first microlens has a radius of curvature in a range from about 2.37 μm to 2.47 μm; said second microlens has a radius of curvature in a range from about 2.40 μm to 2.50 μm; and said third microlens has a radius of curvature in a range from about 2.45 μm to 2.55 μm.

9. The image sensor as claimed in claim 1, wherein said at least two microlenses includes a first microlens having a symmetrical lens structure, which is located at a central area of said image sensor, and a second microlens having an asymmetrical lens structure at least along one horizontal dimension, which is located at a peripheral area of said image sensor.

* * * * *